US009101067B2

(12) United States Patent
Ishizaka et al.

(10) Patent No.: US 9,101,067 B2
(45) Date of Patent: Aug. 4, 2015

(54) METHOD FOR FORMING COPPER WIRING

(71) Applicant: Tokyo Electron Limited, Tokyo (JP)

(72) Inventors: Tadahiro Ishizaka, Yamanashi (JP);
Toshio Hasegawa, Yamanashi (JP)

(73) Assignee: TOKYO ELECTRON LIMITED,
Tokyo (JP)

( * ) Notice: Subject to any disclaimer, the term of this patent is extended or adjusted under 35 U.S.C. 154(b) by 0 days.

(21) Appl. No.: 14/136,838

(22) Filed: Dec. 20, 2013

(65) Prior Publication Data
US 2014/0175046 A1 Jun. 26, 2014

(30) Foreign Application Priority Data

Dec. 20, 2012 (JP) .................. 2012-277925

(51) Int. Cl.
*H01B 13/00* (2006.01)
*H05K 3/10* (2006.01)
*H05K 3/14* (2006.01)
*H05K 3/38* (2006.01)
*H05K 3/46* (2006.01)

(52) U.S. Cl.
CPC .............. *H05K 3/107* (2013.01); *H05K 3/146* (2013.01); *H05K 3/388* (2013.01); *H05K 3/465* (2013.01); *H05K 2203/095* (2013.01); *H05K 2203/1338* (2013.01); *H05K 2203/1476* (2013.01)

(58) Field of Classification Search
USPC ............... 216/18, 37, 67; 438/681, 689–693; 427/248.1, 250
See application file for complete search history.

(56) References Cited

U.S. PATENT DOCUMENTS

| 6,777,332 | B2 * | 8/2004 | Harada | 438/687 |
| 8,247,030 | B2 * | 8/2012 | Suzuki et al. | 427/250 |
| 8,399,353 | B2 * | 3/2013 | Ishizaka et al. | 438/653 |
| 2002/0081844 | A1 * | 6/2002 | Jeon et al. | 438/680 |
| 2008/0200002 | A1 | 8/2008 | Suzuki et al. | |
| 2014/0292166 | A1 | 10/2014 | Hwang et al. | |

FOREIGN PATENT DOCUMENTS

| JP | 07-012305 | 1/1995 |
| JP | 2006-148075 A | 6/2006 |
| KR | 10-2013-0077994 | 7/2013 |

OTHER PUBLICATIONS

Suzuki, Kenji; Method of Depositing Film and Device for Plasma Deposing Film; Abstract of JP 2006-148075; Jun. 8, 2006; http://www19.ipdl.inpit.go.jp/.

* cited by examiner

*Primary Examiner* — Duy Deo
*Assistant Examiner* — Maki Angadi

(57) ABSTRACT

In a Cu wiring forming method for forming a Cu wiring by filling Cu in a recess which is formed in a substrate in a predetermined pattern, a barrier film formed of a TaAlN film is formed at least on the surface of the recess by thermal ALD or thermal CVD. Then a Cu film is formed to fill the recess with the Cu film. Further, the Cu wiring is formed in the recess by polishing the entire surface of the substrate by CMP.

14 Claims, 11 Drawing Sheets

METHOD FOR FORMING COPPER WIRING

CROSS-REFERENCE TO RELATED APPLICATIONS

This application claims priority to Japanese Patent Application No. 2012-277925 filed on Dec. 20, 2012, the entire contents of which are incorporated herein by reference.

FIELD OF THE INVENTION

The present invention relates to a copper (Cu) wiring forming method for forming a copper wiring in a recess such as a trench or a hole formed on a substrate.

BACKGROUND OF THE INVENTION

Various processes such as film formation, etching and the like are repeatedly performed on a semiconductor wafer to manufacture a desired semiconductor device. Recently, in order to meet demands for high-speed semiconductor device, miniaturization of a wiring pattern and high level of integration, it is required to realize low resistance of wiring (high conductivity) and high electromigration resistance.

Accordingly, copper (Cu) having a high electromigration resistance and a higher conductivity (lower resistance) has been investigated as an alternative wiring material to Al or W.

As for the Cu wiring forming method, there has been proposed a technique including: forming a barrier film formed of Ta, Ti, TaN, TiN or the like on an entire interlayer insulating film having a trench or a hole by a plasma sputtering as an example of a physical vapor deposition (PVD); forming a Cu seed film on the barrier film by the plasma sputtering; filling a trench or a hole by performing a Cu plating; and removing a residual Cu thin film or a residual barrier film remaining on the wafer surface by a chemical mechanical polishing (CMP) (see, e.g., Japanese Patent Application Publication No. 2006-148075). A PVD-TaN film attracts attention as a barrier film due to its high barrier properties.

However, along with the progress of the miniaturization of a design rule of a semiconductor device, a hole diameter or a width of a trench has reached several tens of nm, and the formation of a Cu wiring in a recess such as a small trench or a small hole leads to an increase of a wiring resistance. The low resistance of the Cu wiring can be realized by minimizing the thickness of the barrier film to increase the volume of Cu in the recess. However, when the barrier film is formed by PVD as in a conventional case, it is difficult to form a thin and conformal barrier film in the recess.

SUMMARY OF THE INVENTION

In view of the above, the present invention provides a Cu wiring forming method capable of forming a thin and conformal barrier film in a recess and realizing a low resistance of a Cu wiring while ensuring high barrier properties.

The present inventors have repeatedly studied in order to solve the above problems. As a result, they have found that a thin and conformal barrier film can be realized by forming a TaAlN film in a recess by thermal ALD or thermal CVD. Further, it has been found that if the film contains Al, the film can be amorphized even by ALD and the high barrier properties can be obtained. Accordingly, even if the barrier film is thin, the barrier property can be maintained and the low resistance of the wiring can be realized by decreasing the volume of the barrier film and increasing the volume of Cu in the wiring.

In accordance with an aspect of present invention, there is provided a Cu wiring forming method for forming a Cu wiring by filling Cu in a recess, which is formed in a substrate in a predetermined pattern, the Cu wiring forming method including: forming a barrier film of a TaAlN film at least on a surface of the recess by thermal ALD or thermal CVD; forming a Cu film to fill the recess with the Cu film; and forming a Cu wiring in the recess by polishing the entire surface of the substrate by CMP.

A Ru film may be formed by CVD after the barrier film is formed and before the Cu film is formed.

After or during the formation of the TaAlN film, the TaAlN film is preferably subjected to plasma processing to be modified by ion impact applied thereto. The plasma is preferably generated by applying a high frequency power to a mounting table on which the substrate is mounted. The plasma may be an Ar plasma.

When the TaAlN film as the barrier film is formed by thermal ALD, the forming the barrier film includes: a TaN unit film forming step of repeating a predetermined number of times a cycle of supplying a Ta compound as a Ta source material into a processing chamber and adsorbing the Ta compound onto the substrate, purging the processing chamber, converting the adsorbed Ta compound to TaN by nitriding/reduction, and purging the processing chamber: and an AlN unit film forming step of repeating a predetermined number of times a cycle of supplying an Al compound as an Al source material into a processing chamber and adsorbing the Al compound onto the substrate, purging the processing chamber, converting the adsorbed Al compound to AlN by nitriding/reduction, and purging the processing chamber, wherein the ratio between the cycle in the TaN unit film forming step and the cycle in the AlN unit film forming step is set such that an atomic number ratio of Ta:Al in the film satisfies a predetermined value, and the TaN unit film forming step and the AlN unit film forming step are repeated for a specified number of times. The cycle in the TaN unit film forming step is performed 4 to 8 times, and the cycle in the AlN unit film forming step is performed once. The Al source may be adsorbed onto the substrate in an initial stage of film formation. The TaAlN film as the barrier film preferably has a thickness of 2 nm or less.

The formation of the Cu film is performed by an apparatus for producing a plasma from a plasma generating gas in a processing chamber where the substrate is accommodated, scattering particles from a Cu target, ionizing particles in the plasma, and attracting ions onto the substrate by applying a bias power to the substrate.

In accordance with another aspect of the present invention, there is provided a storage medium storing a program executed on a computer to control a Cu wiring forming system, wherein the program, when executed on the computer, controls the Cu wiring forming system to perform the Cu wiring forming method.

In accordance with such configurations, a thin and conformal barrier film can be formed in a recess by using a TaAlN film formed by thermal ALD or thermal CVD. Accordingly, the film is amorphized to have high barrier property. The thin barrier film enables the volume of Cu in the wiring to be increased, so that the low resistance of the Cu wiring can be realized.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described in detail with reference to the accompanying drawings.

Embodiment of Cu Wiring Forming Method

Figure 1:
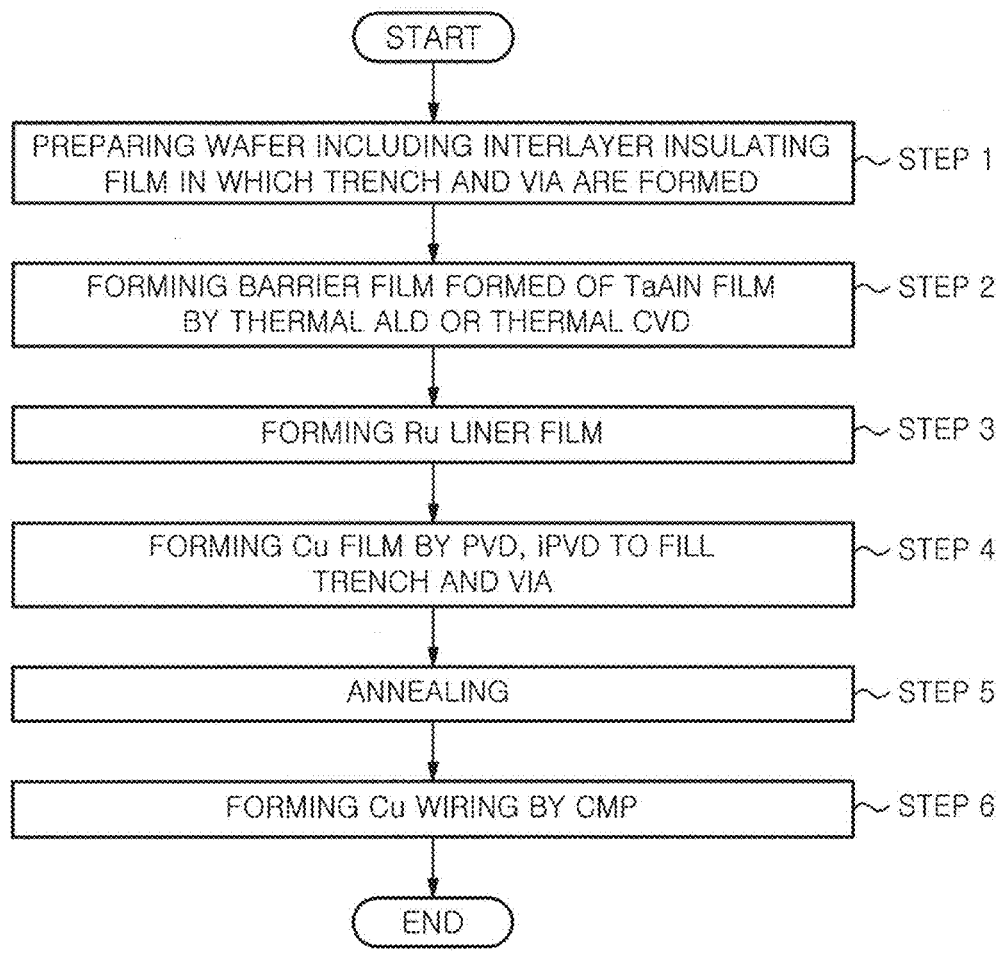
FIG. 1 is a flow chart showing a Cu wiring forming method in accordance with an embodiment of the present invention.

A Cu wiring forming method in accordance with an embodiment of the present invention will be described with reference to a flow chart shown in FIG. 1 and a process cross sectional view shown in FIGS. 2A to 2F.

Figure 2A:
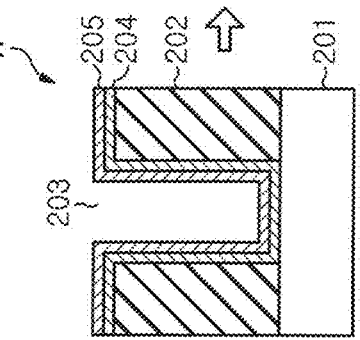
FIGS. 2A to 2F are process cross sectional views for explaining the Cu wiring forming method in accordance with the embodiment of the present invention.

In the present embodiment, first, there is prepared a wafer W including: a base structure 201 (detailed description is omitted); and an interlayer insulating film 202 such as a $SiO_2$ film formed thereon; and a via (not shown) for connection to an underlying Cu wiring (step 1, FIG. 2A). In this wafer W, it is preferable to remove residues generated by etching/asking or moisture on the surface of the insulating film by a degas process or a pre-clean process.

Figure 2B:
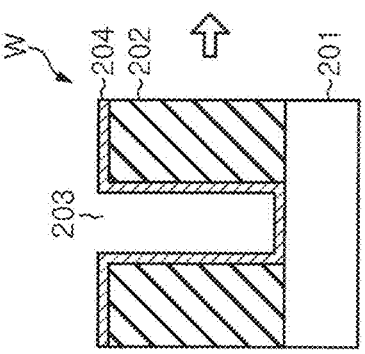

Next, a TaAlN film as a barrier film 204 for suppressing diffusion of Cu is formed on the entire surface including the surface of the via and the trench 203 by thermal ALD (Atomic Layer Deposition) or thermal CVD (Chemical Vapor Deposition) (step 2, FIG. 2B).

Figure 2C:
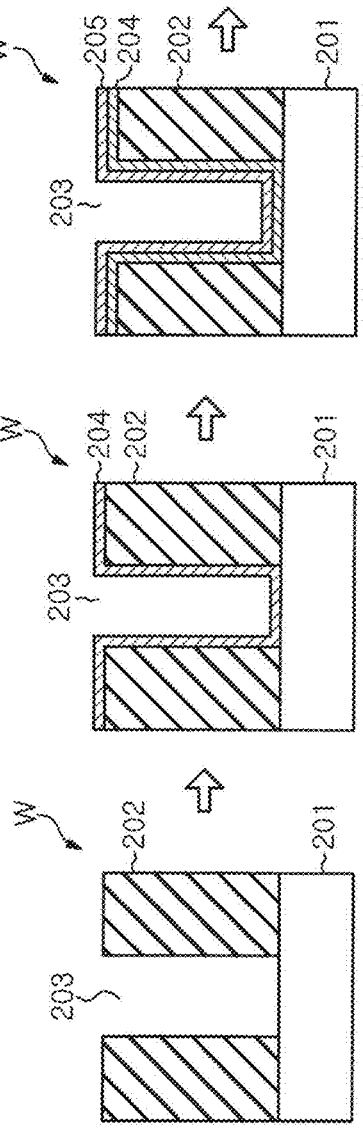

Then, a Ru liner film 205 is formed on the barrier film 204 (step 3, FIG. 2C). At this time, the film formation is preferably performed by CVD.

Figure 2D:
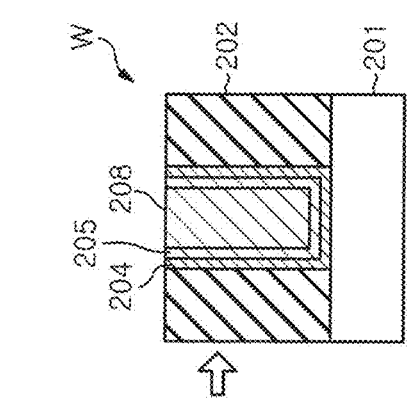

Then, the Cu film 206 is formed by PVD, to fill the trench 203 and the via (not shown) (step 4, FIG. 2D). The film formation at this time is preferably performed by iPVD (ionized physical vapor deposition), e.g., plasma sputtering. At this time, the Cu film 206 is preferably laminated beyond an upper end of the trench 203 for a planarization process to be performed later. However, such a laminated portion may be formed by a plating process, instead of consecutive formation by PVD.

Figure 2E:
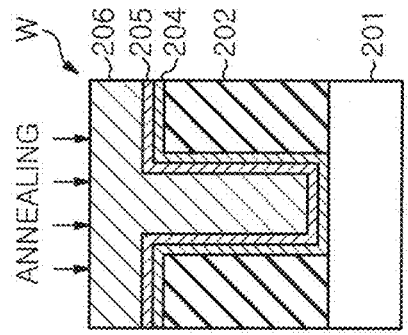

Next, annealing is performed when necessary (step 5, FIG. 2E). By performing the annealing, the Cu film 206 is stabilized.

Figure 2F:
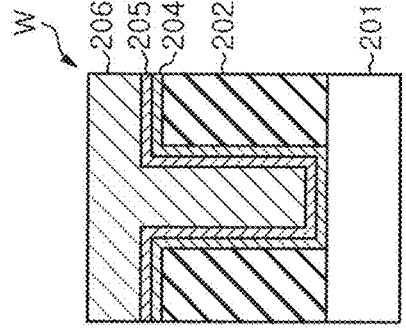

Thereafter, the entire surface of the wafer W is polished by CMP (Chemical Mechanical Polishing), and is planarized by removing the Cu film 206, the Ru liner film 205, the barrier film 204 which are laminated on the interlayer insulating film 202 (step 6, FIG. 2F). Accordingly, a Cu wiring 208 is formed in the trench and the via (hole).

After the Cu wiring 208 is formed, a proper cap film such as a dielectric cap, a metal cap or the like is formed on the entire surface including the Cu wiring 208 on the surface of the wafer W and the interlayer insulating film 202.

Hereinafter, main processes among the above series of processes will be described in detail.

First, the barrier film 204 formed of a TaAlN film will be described. As described above, the barrier film 204 formed of a TaAlN is formed by thermal ALD or thermal CVD.

ALD and CVD substantially allow formation of a film having good step coverage compared to PVD. Therefore, a thin and conformal barrier film 204 can be formed by ALD or CVD. Accordingly, the volume of the barrier film in the recess such as a hole or a trench can be reduced, and the volume of Cu in the wiring can be increased. As a result, the low resistance of the wiring can be realized. However, when a gas is turned into a plasma during the film formation, the underlying interlayer insulating film 202, especially the Low-k film, may be damaged. Therefore, thermal ALD or thermal CVD is used.

The reason that the TaAlN film is used as the barrier film 204 will be described in the following.

A conventional barrier film, i.e., a TaN film formed by PVD, has high barrier properties because it is an amorphous film having no grain boundaries. However, when the TaN film is formed by ALD, the film is crystallized and the barrier properties deteriorate due to the presence of grain boundaries. In the present embodiment, a TaAlN film is formed by adding Al to a TaN film in order to obtain a good amorphous film having high barrier properties by ALD or CVD while maintaining good film quality of a TaN film. TaAlN film formed in this manner keeps an amorphous state because Al has a different crystal size from that of Ta.

In view of increase in the volume of Cu in the wiring, the barrier film 204 needs to have a thin thickness of 2 nm or less.

When a TaAlN film is formed as a barrier film 204 by CVD, there is used a Ta compound gas as a Ta source material, an Al compound gas as an Al source material, and a nitriding gas (reduction gas) for forming a nitride by reducing these source materials.

As for a Ta compound gas as a Ta source material, tertiarybutylimidotris(ethylmethylamino)tantalium (TBTEMT; $(tBuN)Ta(NEtMe)_3$) may be properly used. In addition, it is possible to use TAIMATA($Ta(NMe_2)_3(NCMe_2Et)$), PDEAT ($Ta(NEt_2)_5$), PDMAT($Ta(NMe_2)_5$), PEMAT($Ta(NEtMe)_5$), TBTDET (($tBuN)Ta(NEt_2)_3$), TBTEMT (($tBuN)Ta(NEtMe)_3$), and IPTDET (($iPrN)Ta(NEt_2)_3$).

As for an Al compound gas as an Al source material, trimethyl aluminum (TMA; $Al(CH_3)_3$) may be properly used.

In addition, it is possible to use $AlEt_3$, $AlMe_2H$, $[Al(OsBu)_3]_4$, $Al(CH_3COCHCOCH_3)_3$, $AlCl_3$, $AlBr_3$, $AlI_3$, $Al(OiPr)_3$, $[Al(Nme_2)_3]_2$, $Al(iBu)_2ClAl(iBu)_3$, $Al(iBu)_2H$, $AlEt_2Cl$, $Et_3Al_2(OsBu)_3$, $Al(THD)_3$, $H_3AlNMe_3$, $H_3AlNEt_3$, $H_3AlNMe_2Et$, and $H_3AlMeEt_2$.

As for a nitriding gas (reduction gas), $NH_3$ may be properly used. In addition, $NH(CH_3)_2$, $N_2H_4$, $N_2H_3CH_3$ or the like may be used.

Besides, a purge gas or a dilution gas may be used when necessary. As for the purge gas or the dilution gas, an inert gas such as Ar gas or the like may be used.

The TaAlN film is preferably formed at 300° C. to 400° C. When the TaAlN film is formed, it is preferable to set Al concentration to 10 at. % or above in view of barrier properties. When it is formed by ALD, it is preferable to set a ratio between a TaN supply cycle and an AlN supply cycle to be within a range from 4:1 to 8:1.

After or during the formation of the TaAlN film, it is preferable to perform plasma processing for applying ion impact to the film. By performing the plasma processing, it is possible to modify the film by the ion impact after or during the formation of the film formation, and improve the barrier property of the TaAlN film. Since this plasma processing is carried out to apply ion impact to the film after the TaAlN film is partially or completely formed, not convert a gas into a plasma during the film formation, it does not inflict damage to the underlying interlayer insulating film 202 (Low-k film). In this plasma processing, in order to apply ion impact to the film, it is preferable to generate a plasma by applying a high frequency power to a mounting table which mounts thereon a wafer W and attract ions into the wafer W, as will be described later.

In this plasma processing, Ar gas is preferably used as a plasma gas. In addition, Kr or Xe may be used. Further, the plasma processing conditions preferably include a pressure of about 1 Torr and a power of about 400 W at a TaAlN film formation temperature.

FIGS. 3 to 6 show examples of a sequence of forming a barrier film 204 using thermal ALD. In the sequence shown in FIG. 3, a TaAlN film is formed by repeating a TaN unit film forming step (step A) and an AlN unit film forming step (step B) multiple times until a desired film thickness is obtained and, finally, plasma processing, e.g., Ar plasma processing (step C), is carried out.

In the TaN unit film forming step (step A), a process of supplying a Ta compound gas as a Ta source material, e.g., TBTEMT, and adsorbing it onto a surface of a wafer (substrate) (a1), a process of purging the Ta compound gas remaining in a processing chamber (a2), a process of reducing and nitriding the Ta compound adsorbed onto the wafer (substrate) by supplying a nitriding gas (reduction gas), e.g., NH3 gas (a3), and a process of purging the nitriding gas (reduction gas) remaining in the processing chamber and reaction by-products (a4) are sequentially carried out and repeated, e.g., 4 to 8 cycles.

In the AlN unit film forming step (step B), a process of supplying an Al compound gas as an Al source material, e.g., TMA, and adsorbing it onto the surface of the wafer (substrate) (b1), a process of purging the Al compound gas remaining in the processing chamber (b2), a process of reducing and nitriding the Al compound adsorbed onto the wafer (substrate) by supplying a nitriding gas (reduction gas), e.g., NH3 gas (b3), and a process of purging the nitriding gas (reduction gas) remaining in the processing chamber and reaction by-products (b4) are sequentially carried out.

Figure 3:
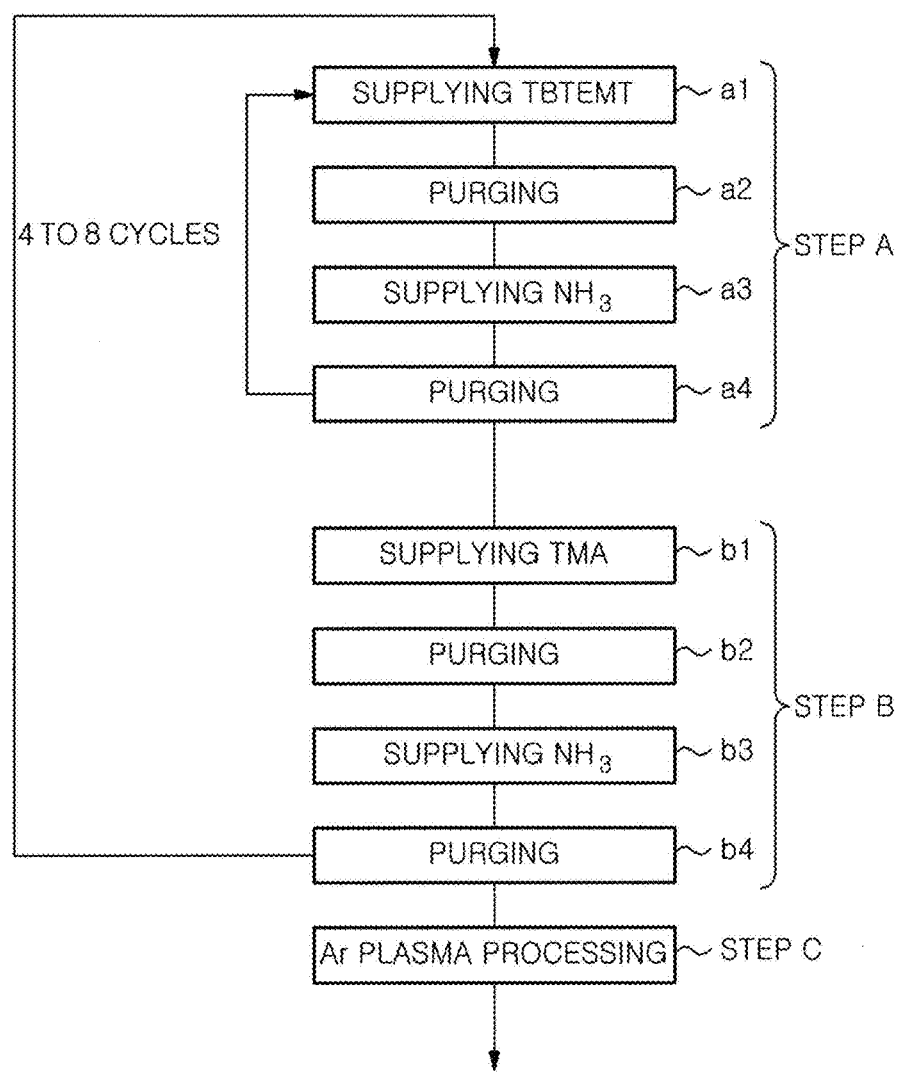
FIG. 3 is a flow chart showing an example of a sequence of forming a TaAlN film as a barrier film.
Figure 4:
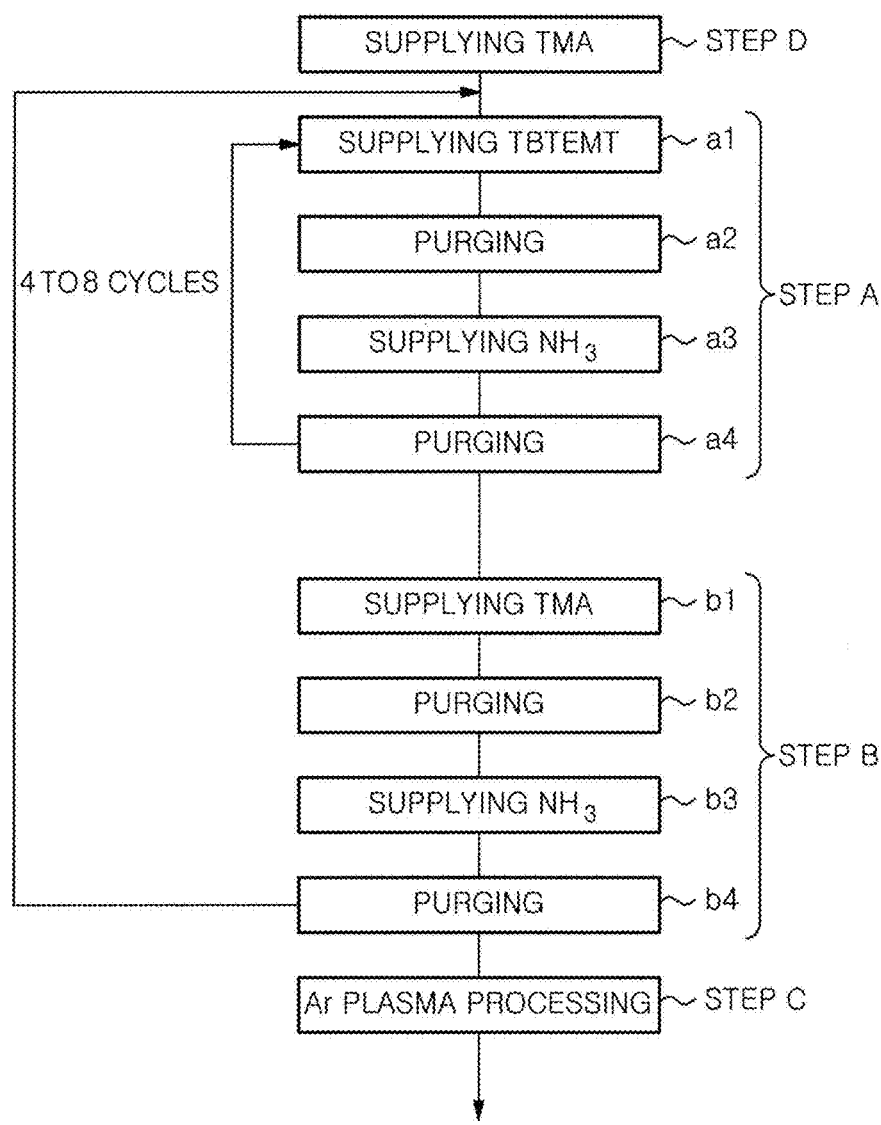
FIG. 4 is a flow chart showing another example of a sequence of forming a TaAlN film as a barrier film.

In the sequence shown in FIG. 4, first, a step of supplying an Al compound gas, e.g., TMA, and adsorbing it onto the surface of the wafer (substrate) (step D) is performed. Then, as shown in the example of FIG. 3, the steps A and B are repeated multiple times until a TaAlN film having a desired film thickness is formed. Then, finally, the plasma processing, e.g., Ar plasma processing (step C) is performed. Since the Al compound such as TMA has high adsorptivity, the incubation time (between the supply start of the source gas and the initiation of the film formation) can be shortened.

Figure 5:
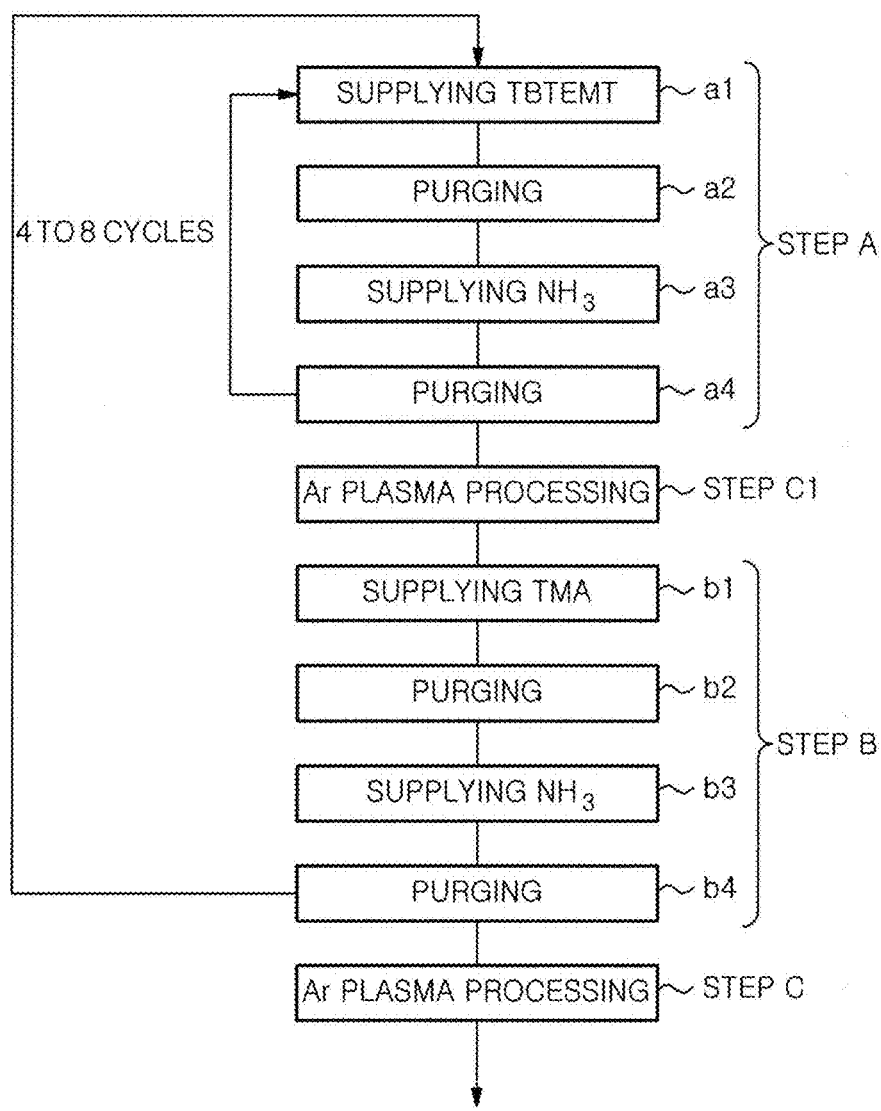
FIG. 5 is a flow chart showing still another example of a sequence of forming a TaAlN film as a barrier film.
Figure 6:
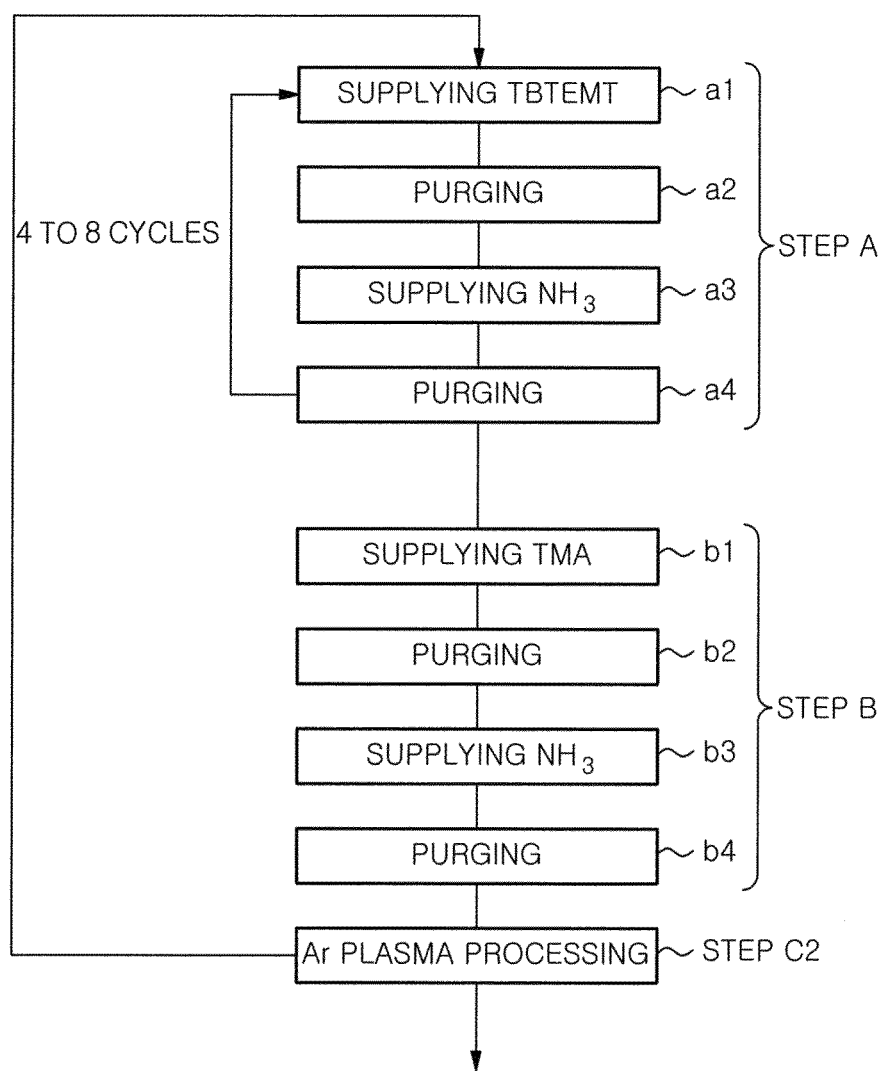
FIG. 6 is a flow chart showing still another example of a sequence of forming a TaAlN film as a barrier film.

The sequences shown in FIGS. 5 and 6 reinforce the plasma processing. In the sequence shown in FIG. 5, Ar plasma processing C1 between the steps A and B is added to the sequence shown in FIG. 3, and the steps A, C1, and B are repeated. In the sequence shown in FIG. 6, Al plasma processing C2 is performed after the steps A and B and, then, the steps A, B, and C2 are repeated.

Moreover, in the examples shown in FIGS. 3 to 6, the TaN unit film forming step is performed four to eight cycles and the AlN unit film forming step is performed one cycle. The ratio between the TaN supply cycle and the AlN supply cycle ranges from 4:1 to 8:1, and Al is introduced into the TaAlN film in accordance with the cycle ratio. Here, the AlN unit film forming step may be performed a predetermined number of cycles such that the ratio between the TaN supply cycle and the AlN supply cycle ranges from 4:1 to 8:1.

The film quality of the barrier film 204 affects, if a Ru liner film 205 is formed later, the nucleation of Ru. When the barrier film 204 is not continuous or the density of the film is low, the nucleation of Ru thereon is not uniform, and a good film (dense and continuous film) is hardly obtained. In view of the above, the TaAlN film formed by thermal ALD or thermal CVD in the present embodiment has a good film quality. Thus, the Ru liner film formed thereon has a good film quality.

Next, a test that has examined barrier property of the barrier film 204 formed of such a TaAlN film will be described. Here, samples were obtained by forming various TaAlN films shown in Table 1 on a Si substrate, forming a Cu film having a thickness of 50 nm thereon by iPVD, and performing annealing under the $Ar/H_2$ atmosphere at 400° C. for about 60 min. The barrier properties were examined from the surfaces states of the samples. As for the TaAlN film, one group was formed by performing either one of "pre AlN" or "post Ar plasma" and another group was formed by performing neither "pre AlN" or "post Ar plasma" while varying the ratio between the TaN supply cycle and the AlN supply cycle TaN:AlN to 1:1 to 8:1 and a target film thickness to 1 nm and 2 nm, as shown in Table 1. In the case of "pre AlN", the AlN unit film was formed first and then the TaN unit film was formed. In the other cases, the TaN unit film was formed first and, then, the AlN film was formed. As for the "post Ar plasma", Ar plasma processing was performed after the completion of the formation of the TaAlN film.

TABLE 1

| No | TaN:AlN | pre AlN | Plasma processing | Target film thickness |
|---|---|---|---|---|
| 1 | 4:1 | — | — | 2 nm |
| 2 | 4:1 | — | — | 1 nm |
| 3 | 2:1 | — | — | 2 nm |
| 4 | 2:1 | — | — | 1 nm |
| 5 | 1:1 | — | — | 2 nm |
| 6 | 1:1 | — | — | 1 nm |
| 7 | 8:1 | — | — | 2 nm |
| 8 | 8:1 | — | — | 1 nm |
| 9 | 4:1 | pre AlN | — | 2 nm |
| 10 | 4:1 | pre AlN | — | 1 nm |
| 11 | 8:1 | pre AlN | — | 2 nm |

TABLE 1-continued

| No | TaN:AlN | pre AlN | Plasma processing | Target film thickness |
|---|---|---|---|---|
| 12 | 8:1 | pre AlN | — | 1 nm |
| 13 | 4:1 | — | post Ar plasma | 2 nm |
| 14 | 4:1 | — | post Ar plasma | 1 nm |
| 15 | 8:1 | — | post Ar plasma | 2 nm |
| 16 | 8:1 | — | post Ar plasma | 1 nm |

Figure 7:
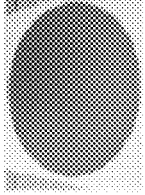
FIG. 7 shows a result of a test that has examined barrier properties depending on conditions of formation of a TaAlN film as a barrier film.

In this test, the surface of the Cu film having a good barrier property has a copper color, whereas the surface of the Cu film having a poor barrier property is discolored. FIG. 7 shows results thereof. In this drawing, light-colored portions indicate surfaces having a copper color. As shown in this drawing, as the ratio of TaN:AlN is increased, the barrier property becomes good. Even if the "post Ar plasma" was not performed, when the ratio TaN:AlN was 8:1, the surface of the Cu film was hardly discolored at the barrier film thickness of 2 nm. When the ratio TaN:AlN was 4:1, the color was discolored only at the central portion. On the other hand, when the ratio TaN:AlN was 2:1 and 1:1, the color of the entire surface of the Cu film was discolored. In the sample in which "pre AlN" was performed, the color of the surface of the Cu film was discolored, and the barrier property was not improved by the "pre AlN". In the samples in which the "post Ar plasma" was performed, when the ratio TaN:AlN were 8:1 and 4:1, the surface of the Cu film was hardly discolored at the barrier film thickness of 1 nm and 2 nm of the barrier film and the barrier property was improved by the plasma processing.

This test was performed to examine approximate effect of the processing conditions on the barrier property. The conditions that have resulted in a poor barrier property in this test may result in a good barrier property by optimizing other conditions.

Next, a Ru liner film 205 will be described.

Since Ru has high wettability to Cu, forming the Ru liner film at the base of Cu ensures good mobility of Cu in forming a Cu film by the iPVD, and it can suppress the formation of an overhang which blocks an opening of the trench or the hole. Therefore, Cu can be reliably filled even in a fine trench or hole without forming a void therein.

In order to realize a low resistance of wiring by increasing the volume of Cu filled in the trench or the hole, the Ru liner film preferably has a thin thickness in a range from 1 nm to 5 nm.

The Ru liner film 205 is preferably formed by a thermal CVD while using $Ru_3(CO)_{12}$ as a film forming material. Accordingly, a thin Ru film having high purity can be formed with a high step coverage. The film forming conditions are as follows: a pressure in the processing chamber ranging from 1.3 Pa to 66.5 Pa; and a film forming temperature (wafer temperature) ranging from 150° C. to 250° C. The Ru liner film 205 may be formed by the PVD or the CVD using another film forming material other than $Ru_3(CO)_{12}$, such as a ruthenium pentadienyl compound, e.g., (cyclopentadienyl)(2,4-dimethylpentadienyl)ruthenium, bis(cyclopentadienyl)(2,4-methylpentadienyl)ruthenium, (2,4-dimethylpentadienyl)(ethylcyclopentadienyl)ruthenium, or bis(2,4-methylpentaenyl)(ethylcyclopentadienyl)ruthenium.

Further, when the opening of the trench or the via is wide and the overhang is hardly formed, it is not necessary to form the Ru liner film 205, and the Cu film may be directly formed on the barrier film 204.

Next, the formation of the Cu film 206 will be described. The Cu film 206 is formed by PVD. As described above, however it is preferable to use iPVD, e.g., plasma sputtering.

In the conventional PVD film formation, the overhang that blocks (covers) the opening of the trench or the hole is likely to be formed due to agglomeration of Cu. However, when the iPVD is used to control the film formation by Cu ions and the etching by ions (Ar ions) of the plasma generation gas while adjusting the bias power applied to the wafer, the formation of the overhang can be suppressed due to the mobility of Cu. Accordingly, good filling can be obtained even in a trench or a hole having a narrow opening. At this time, it is preferable to perform a high-temperature process (in a temperature ranging from 65° C. to 350° C.) in which Cu is migrated in order to ensure mobility of Cu and obtain good filling. Further, as described above, by providing the Ru liner film 205 having high wettability to Cu at the base of the Cu film 206, Cu moves without agglomeration on the Ru liner film. Accordingly, the formation of overhang can be suppressed even in the fine recess, and Cu can be reliably filled therein without forming a void.

When the overhang is hardly formed due to a large opening width of a trench or a hole, the film formation can be performed at a high speed by a low-temperature process (in a temperature ranging from −50° C. to 0° C.) in which the migration of Cu does not occur.

Further, a pressure in the processing chamber (processing pressure) during the formation of a Cu film is preferably in a range from 1 mTorr to 100 mTorr (from 0.133 Pa to 13.3 Pa) and more preferably in a range from 35 mTorr to 90 mTorr (from 4.66 Pa to 12.0 Pa).

In accordance with the present embodiment, a TaAlN film used as the barrier film 204 formed in the trench 203 or the via (hole) formed in the interlayer insulating film 202 is formed by thermal ALD or thermal CVD. Accordingly, a thin and conformal film can be formed compared to the conventional case of using PVD. Further, the low resistance of the wiring can be realized by decreasing the volume of the barrier film 204 and increasing the volume of Cu in the wiring.

Moreover, a TaAlN film serving as the barrier film 204 is obtained by changing a part of Ta of the TaN film, which is used as a conventional barrier film, to Al. Due to a difference in an atom radius between Ta and Al, the TaAlN film can be amorphized even by ALD that easily crystallizes a film. Therefore, an amorphous film having no grain boundaries can be obtained while maintaining a good film quality of a barrier material of a conventional TaN film, and a thin film having high barrier property can be formed.

By performing plasma processing during the formation of the barrier film 204 and modifying the film by applying ion impact to the film, the barrier property can be further improved.

When the barrier film 204 is formed, an Al compound is adsorbed first. Accordingly, the incubation time can be shortened, and the throughput can be increased.

Among the above series of processes, the step 2 of forming the barrier film 204, the step 3 of forming the Ru liner film 205, and the step 4 of forming the Cu film 206 are preferably performed consecutively in vacuum without being exposed to the atmosphere. However, the exposure to the atmosphere may occur between the above steps.

<Film Forming System Suitable for Implementation of the Embodiments of the Present Invention>

Figure 8:
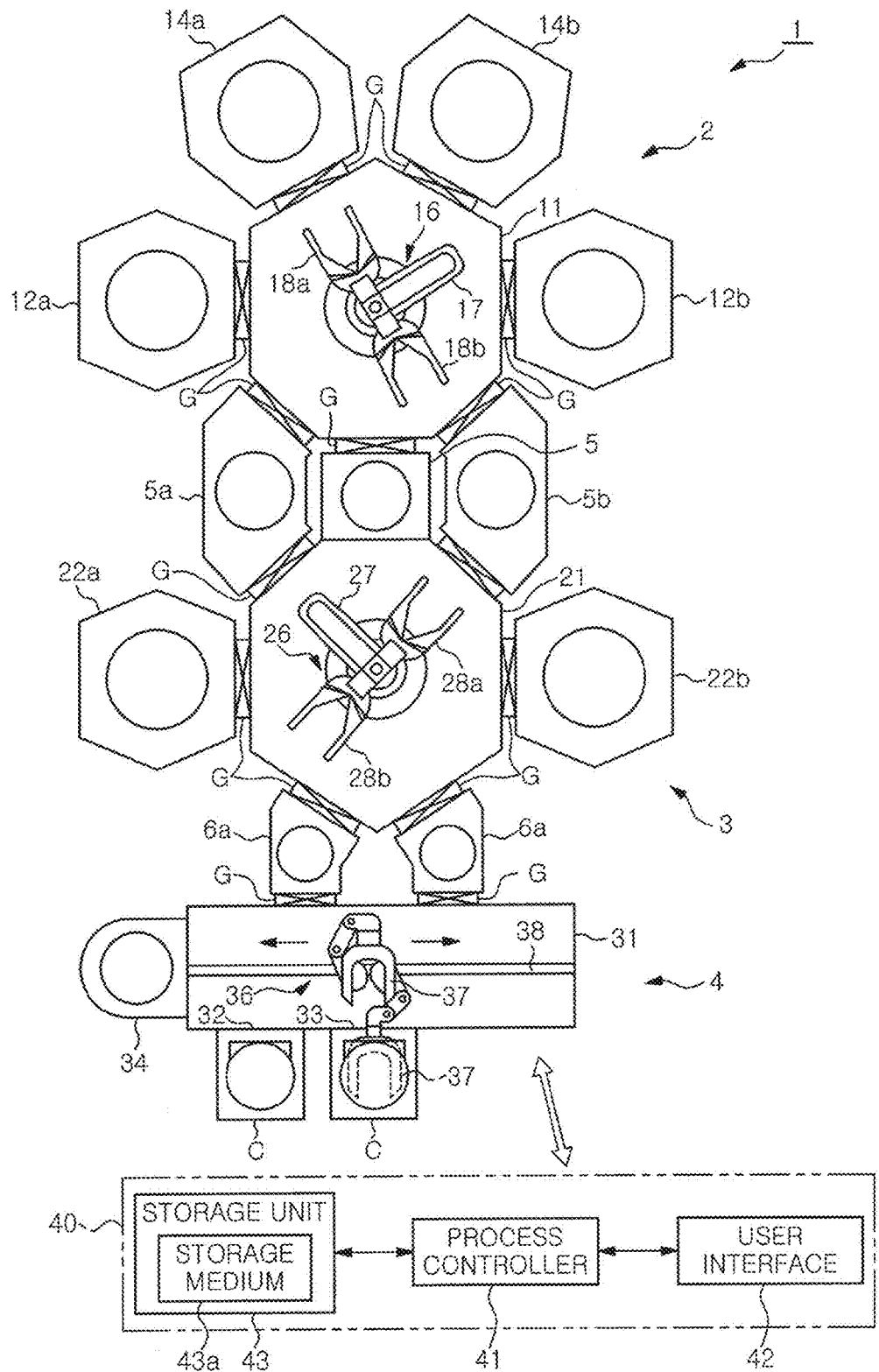
FIG. 8 is a top view showing an example of a multi-chamber type film forming system suitable for implementation of a Cu wiring forming method in accordance with an embodiment of the present invention.

Hereinafter, a film forming system suitable for implementation of the Cu wiring forming method in accordance with the embodiments of the present invention will be described. FIG. 8 is a top view showing an example of a multi-chamber type film forming system suitable for implementation of the Cu wiring forming methods in accordance with the embodiments of the present invention.

The film forming system 1 includes a first processing unit 2 for forming a barrier film and a Ru liner film, a second processing unit 3 for forming a Cu film, and a loading/unloading unit 4. The film forming system 1 is provided for use in a Cu wiring formation on a semiconductor wafer (hereinafter, simply referred to as "wafer") W.

The first processing unit 2 has a first vacuum transfer chamber 11 having a heptagonal cross section, and two barrier film forming apparatuses 12a and 12b and two Ru liner film forming apparatuses 14a and 14b which are connected to walls corresponding to four sides of the first vacuum transfer chamber 11. The barrier film forming apparatus 12a and the Ru liner film forming apparatus 14a are disposed in line symmetry with the barrier film forming apparatus 12b and the Ru liner film forming apparatus 14b.

Degas chambers 5a and 5b each for performing a degas process on the wafer W are connected to walls corresponding to another two sides of the first vacuum transfer chamber 11. Further, a delivery chamber 5 through which the wafer W is transferred between the first vacuum transfer chamber 11 and a second vacuum transfer chamber 21 to be described later is connected to a wall corresponding to the other side of the first vacuum transfer chamber 11 between the degas chambers 5a and 5b of the first vacuum transfer chamber 11.

The barrier film forming apparatuses 12a and 12b, the Ru liner film forming apparatuses 14a and 14b, the degas chambers 5a and 5b, and the delivery chamber 5 are connected to the respective sides of the first vacuum transfer chamber via gate valves G. They communicate with the first vacuum transfer chamber 11 by opening the corresponding gate valves G and are isolated from the first vacuum transfer chamber 11 by closing the corresponding gate valves G.

The inner space of the first vacuum transfer chamber 11 is maintained at a predetermined vacuum atmosphere. Provided in the first vacuum transfer chamber 11 is a first transfer mechanism 16 for loading and unloading the wafer W into and from the barrier film forming apparatuses 12a and 12b, the Ru liner film forming apparatuses 14a and 14b, the degas chambers 5a and 5b, and the delivery chamber 5. The first transfer mechanism 16 is disposed substantially at the center of the first vacuum transfer chamber 11, and has a rotatable and extensible/contractible portion 17. The rotatable and extensible/contractible portion 17 has two support arms 18a and 18b for supporting the wafer W at leading ends thereof. The two support arms 18a and 18b are attached to the rotatable and extensible/contractible portion 17 to be directed in the opposite directions.

The second processing unit 3 includes: a second vacuum transfer chamber 21 having a heptagonal cross section; and two Cu film forming apparatuses 22a and 22b connected to walls corresponding to two opposite sides of the second vacuum transfer chamber 21, for filling Cu in a recess such as a trench or a via. The Cu film forming apparatuses 22a and 22b may be used for performing a series of operations from the filling of the recess to the formation of laminated portions beyond the upper end of the recess. Or, the Cu film forming apparatuses 22a and 22b may be used only for the filling, and the laminated portions may be formed by plating.

The degas chambers 5a and 5b are connected to walls corresponding to another two sides of the second vacuum transfer chamber 21, which face the first processing unit 2, and the delivery chamber 5 is connected to a wall corresponding to a side of the second vacuum transfer chamber 21 between the degas chambers 5a and 5b. In other words, the delivery chamber 5 and the degas chambers 5a and 5b are provided between the first vacuum transfer chamber 11 and the second vacuum transfer chamber 21 while the delivery chamber 5 is disposed between the degas chambers 5a and 5b. Moreover, load-lock chambers 6a and 6b, which allow the atmospheric transfer and the vacuum transfer, are connected to respective walls corresponding to two sides of the second vacuum transfer chamber 21, which face the loading/unloading unit 4.

The Cu film forming apparatuses 22a and 22b, the degas chambers 5a and 5b, and the load-lock chambers 6a and 6b are connected to the respective sides of the second vacuum transfer chamber 21 via gate valves G. They communicate with the second vacuum transfer chamber 21 by opening the corresponding valves G and are isolated from the second vacuum transfer chamber 21 by closing the corresponding gate valves G. The delivery chamber 5 is connected to the second transfer chamber 21 without providing a gate valve therebetween.

The inner space of the second vacuum transfer chamber is maintained at a predetermined vacuum atmosphere. Provided in the second vacuum transfer chamber 21 is a second transfer mechanism 26 for loading and unloading the wafer W into and from the Cu film forming apparatuses 22a and 22b, the degas chambers 5a and 5b, the load-lock chamber 6a and 6b and the delivery chamber 5. The second transfer mechanism 26 is disposed substantially at the center of the second vacuum transfer chamber 21, and has a rotatable and extensible/contractible portion 27. The rotatable and extensible/contractible portion 27 has two support arms 28a and 28b for supporting the wafer W at leading ends thereof. The two support arms 28a and 28b are attached to the rotatable and extensible/contractible portion 27 to be directed in the opposite directions.

The loading/unloading unit 4 has an atmospheric transfer chamber 31 connected to the load-lock chambers 6a and 6b, and is provided at the side of the load-lock chambers 6a and 6b opposite to the second processing unit 3 with the load-lock chambers 6a and 6b between the loading/unloading unit 4 and the second processing unit 3. Gate valves G are provided at walls between the load-lock chambers 6a and 6b and the atmospheric transfer chamber 31. Provided at a wall of the atmospheric transfer chamber 31 opposite to the wall connected to the load-lock chambers 6a and 6b are two connecting ports 32 and 33 each for connecting carriers C accommodating therein wafers W as target substrates. Each of the connecting ports 32 and 33 is provided with a shutter (not shown). When the carrier C that is either empty or accommodates therein wafers W is directly mounted therein, the shutter is opened and the inner space of the carrier C communicates with that of the atmospheric transfer chamber 31 while preventing intrusion of air from outside. Further, an alignment chamber 34 is provided at a side of the atmospheric transfer chamber 31, and the alignment of the wafer W is performed therein. Provided in the atmospheric transfer chamber 31 is an atmospheric transfer mechanism 36 for loading and unloading the wafer W into and from the carrier C and the load-lock chambers 6a and 6b. The atmospheric transfer mechanism 36 has two multi-joint arms and can move on a rail 38 along the arrangement direction of the carriers C. Therefore, the atmospheric transfer mechanism 36 performs the transfer of wafers while mounting the wafer W on hands 37 provided at leading ends of the respective arms.

The film forming system 1 includes a control unit 40 for controlling the respective components of the film forming system 1. The control unit 40 includes a process controller 41 having a microprocessor (computer) for controlling the respective components of the film forming system 1. A user interface 42 and a storage unit 43. The user interface 42 includes a keyboard through which an operator performs a command input to manage the film forming system 1, a display for visually displaying the operational states of the film forming system 1, and the like. The storage unit 43 stores therein control programs to be used in realizing various processes performed by the film forming system 1 under the control of the process controller 41, programs, i.e., recipes, to be used in operating the respective components of the film forming system 1 to carry out processes under processing conditions and various data. The user interface 42 and the storage unit 43 are connected to the process controller 41.

The recipes are stored in a storage medium 43a inside the storage unit 43. The storage medium 43a may be a hard disk or a portable medium such as a CD-ROM, a DVD, a flash memory or the like. Alternatively, the recipes may be suitably transmitted from other devices via, e.g., a dedicated transmission line.

If necessary, a recipe is read out from the storage unit 43 under the instruction from the user interface 42 and is executed by the process controller 41. Accordingly, a desired process is performed in the film forming system 1 under the control of the process controller 41.

In the film forming system 1, the wafer W having trenches or holes of a predetermined pattern is unloaded from the carrier C and loaded into the load-lock chamber 6a or 6b by the atmospheric transfer mechanism 36. After the pressure in the corresponding load-lock chamber is decreased to a vacuum level equivalent to that in the second vacuum transfer chamber 21, the wafer W is unloaded from the corresponding load-lock chamber to be loaded into the degas chamber 5a or 5b through the second vacuum transfer chamber 21 by the second transfer mechanism 26. Thus, the wafer W is subjected to the degas process.

Thereafter, the wafer W is unloaded from the corresponding degas chamber to be loaded into the barrier film forming apparatus 12a or 12b through the first vacuum transfer chamber 11 by the first transfer mechanism 16. Thus, a TaAlN film or the like is formed as a barrier film by thermal ALD or thermal CVD. After the barrier film is formed, the wafer W is unloaded from the barrier film forming apparatus 12a or 12b to be loaded into the Ru liner film forming apparatus 14a or 14b by the first transfer mechanism 16. Thus, a Ru liner film is formed.

After the Ru liner film is formed, the wafer W is unloaded from the Ru liner film forming apparatus 14a or 14b and transferred into the delivery chamber 5 by the first transfer mechanism 16. Thereafter, the wafer W is unloaded from the delivery chamber 5 to be loaded into the Cu film forming apparatus 22a or 22b through the second vacuum transfer chamber 21 by the second transfer mechanism 26. Thus, the Cu film is formed. After the Cu film is formed, the wafer W is unloaded from the Cu film forming apparatus 22a or 22b to be transferred into the load-lock chamber 6a or 6b by the second transfer mechanism 26. After the pressure in the load-lock chamber is returned to the atmospheric pressure, the wafer W having the Cu film is unloaded by the atmospheric transfer mechanism 36 and returned to the carrier C. These processes are repeated for the number of wafers W in the carrier.

In accordance with the film forming system 1, the film forming process can be integrally performed on the etched/asked wafer. Further, the barrier film formed of a TaAlN film, the Ru liner film and the Cu film are formed without exposing to the atmosphere. Therefore, oxidation on the interfaces of the films can be avoided, a high-performance Cu wiring can be obtained.

In addition, when the laminated portion (layer) is formed by Cu plating, the wafer W is unloaded after the Cu film is formed.

<Cu Film Forming Apparatus>

Figure 9:
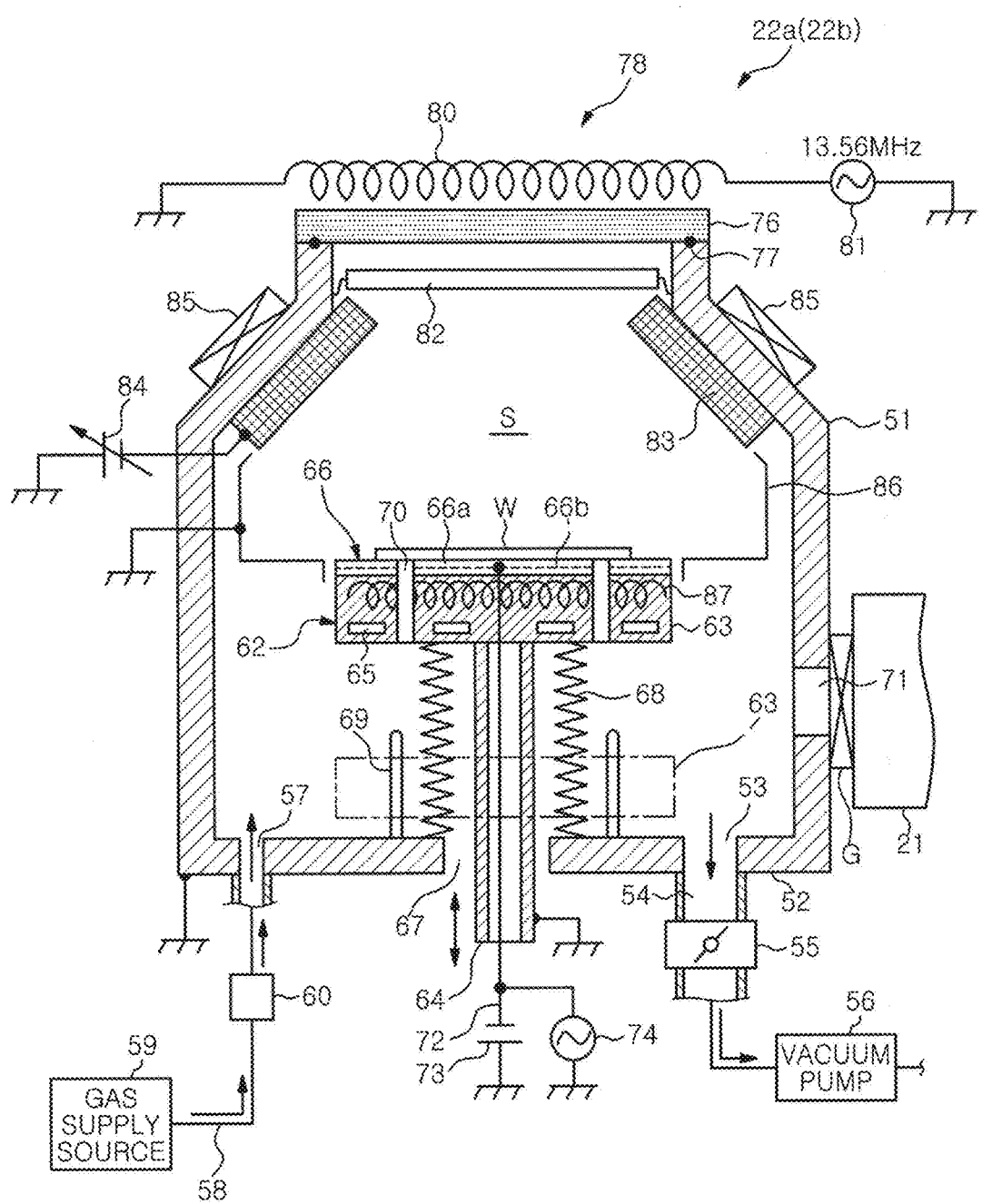
FIG. 9 is a cross sectional view showing a Cu film forming apparatus for forming a Cu film, which is installed in the film forming system shown in FIG. 8.

Hereinafter, a preferred example of the Cu film forming apparatus 22a (22b) for forming a Cu film will be described. FIG. 9 is a cross sectional view showing an example of the first Cu film forming apparatus. Further, the second Cu film forming apparatus has the same configuration.

Here, an inductively coupled plasma (ICP) type plasma sputtering apparatus that is an iPVD apparatus will be described as an example of the Cu film forming apparatus.

As shown in FIG. 9, the Cu film forming apparatus 22a (22b) includes a cylindrical processing chamber 51 made of, e.g., aluminum or the like. The processing chamber 51 is grounded, and a gas exhaust port 53 is provided at a bottom portion 52 thereof. A gas exhaust line 54 is connected to the gas exhaust port 53. A throttle valve 55 and a vacuum pump 56 for controlling a pressure are connected to the gas exhaust line 54, and thus the inner space of the processing chamber 51 can be evacuated to vacuum. Further, a gas inlet port 57 for introducing a predetermined gas into the processing chamber 51 is provided at the bottom portion 52 of the processing chamber 51. The gas inlet port 57 is connected to a gas supply line 58, and the gas supply line 58 is connected to a gas supply source 59 for supplying a rare gas serving as a plasma excitation gas, e.g., Ar gas, or another required gas, e.g., $N_2$ gas. The gas supply line 58 is provided with a gas control unit 60 having a gas flow rate controller, a valve and the like.

Provided in the processing chamber 51 is a mounting mechanism 62 for mounting thereon a wafer W as a target substrate. The mounting mechanism 62 has a circular plate-shaped mounting table 63, and a hollow cylindrical column 64, which is grounded, for supporting the mounting table 63. The mounting table 63 is made of a conductive material, e.g., an aluminum alloy or the like, and is grounded via the column 64. The mounting table 63 has therein a cooling jacket 65 through which a coolant is supplied via a coolant path (not shown). Further, in the mounting table 63, a resistance heater 87 coated with an insulating material is provided above the cooling jacket 65. The resistance heater 87 is electrically powered by a power supply (not shown). The mounting table 63 is provided with a thermocouple (not shown), so that the wafer can be controlled to be maintained at a predetermined temperature by controlling a supply of coolant to the cooling jacket 65 and a supply of power to the resistance heater 87 based on the temperature detected by the thermocouple.

Provided on the top surface of the mounting table 63 is a thin circular plate-shaped electrostatic chuck 66 in which an electrode 66b is embedded in a dielectric member 66a made of, e.g., alumina or the like. Accordingly, the wafer W can be electrostatically attracted and held by electrostatic force. The lower portion of the column 64 extends downward through an insertion hole 67 formed at the center of the bottom portion 52 of the processing chamber 51. The column 64 is vertically movable by an elevation unit (not shown), so that the entire mounting mechanism 62 is vertically moved.

An extensible/contractible metal bellows 68 is provided to surround the column 64. The metal bellows 68 has an upper end hermitically attached to the bottom surface of the mounting table 63 and a lower end hermitically attached to the top surface of the bottom portion 52 of the processing chamber 51. Accordingly, the mounting mechanism 62 can be vertically moved while maintaining the airtightness in the processing chamber 51.

A plurality of, e.g., three (only two are shown in FIG. 9) support pins 69 is uprightly mounted on the bottom portion 52 toward the up side, and pin insertion through holes 70 are formed in the mounting table 63 so as to correspond to the support pins 69. Therefore, when the mounting table 63 is lowered, the upper end portions of the support pins 69 pass through the pin insertion through holes 70 and receive the wafer W, so that the wafer W is transferred to a transfer arm (not shown), which comes from the outside. Therefore, a loading/unloading opening 71 through which the transfer arm moves in and out is provided at a lower sidewall of the processing chamber 51, and an openable/closeable gate valve G is provided at the loading/unloading opening 71. The second vacuum transfer chamber 21 is provided on the side of the gate valve G opposite to the processing chamber 51.

A power supply 73 for the electrostatic chuck 66 is connected to the electrode 66b of the electrostatic chuck 66 through a power supply line 72. By applying a DC voltage from the power supply 73 to the electrode 66b, the wafer W is electrostatically attracted and held by electrostatic force. Further, a high frequency bias power supply 74 is connected to the power supply line 72, so that a high frequency bias power is applied to the electrode 66b of the electrostatic chuck 66 through the power supply line 72 to apply a bias power to the wafer W. The frequency of the high frequency power is preferably in a range from about 400 kHz to 60 MHz, e.g., about 13.56 MHz.

A high frequency transmission plate 76 made of a dielectric material, e.g., alumina or the like, is hermitically provided at the ceiling portion of the processing chamber 51 via a seal member 77 such as an O-ring or the like. Further, a plasma generating source 78, for generating a plasma from a rare gas as a plasma excitation gas, e.g., Ar gas, in a processing space S of the processing chamber 51, is provided above the transmission plate 76. The plasma excitation gas may be another rare gas, e.g., He, Ne, Kr or the like, other than Ar.

The plasma generating source 78 has an induction coil 80 disposed so as to correspond to the transmission plate 76. A high frequency power supply 81 having a high frequency of, e.g., 13.56 MHz for plasma generation is connected to the induction coil 80, so that a high frequency power is introduced into the processing space S through the transmission plate 76 and an induced electric field is formed.

Moreover, a baffle plate 82 made of e.g. aluminum, is provided directly under the transmission plate 76 to diffuse the introduced high frequency power. Further, disposed below the baffle plate 82 to surround the upper region of the processing space S is a target 83 formed of Cu having an annular shape with an inwardly upwardly inclined cross section (truncated cone shape), for example. A variable-voltage DC power supply 84 is connected to the target 83 in order to apply a DC power for attracting Ar ions. Alternatively, an AC power supply may be used instead of the DC power supply.

Further, a magnet 85 is provided at the outer circumferential side of the target 83 to apply a magnetic field to the target 83. The target 83 is bombarded by Ar ions in the plasma so that Cu atoms or Cu atomic groups are ejected from the target 83 and they are mostly ionized while passing through the plasma.

Moreover, a cylindrical protection cover member 86 made of, e.g., aluminum or copper, is provided under the target 83 to surround the processing space S. The protection cover member 86 is grounded and a lower portion thereof is bent inward so as to be positioned near the side portion of the mounting table 63. Thus, an inner end of the protection cover member 86 is disposed to surround the outer peripheral side of the mounting table 63.

In the first Cu film forming apparatus configured as described above, the wafer W is loaded into the processing chamber 51 shown in FIG. 9 and mounted on the mounting table 63. Then, the wafer W is electrostatically attracted to and held on the electrostatic chuck 66, and the following processes are carried out under the control of the control unit 40. At this time, the temperature of the mounting table 63 is controlled by controlling the supply of coolant to the cooling jacket 65 or the supply of power to the resistance heater 87 based on the temperature detected by the thermocouple (not shown).

First, the processing chamber 51 is set to be maintained at a predetermined vacuum state by operating the vacuum pump 56. Then, Ar gas is supplied to the processing chamber 51 at a predetermined flow rate by controlling the gas control unit 60, and at the same time, the processing chamber 51 is maintained at a predetermined vacuum level by controlling the throttle valve 55. Next, a DC power is applied to the target 83 from the variable DC power supply 84, and a high frequency power (plasma power) is supplied to the induction coil 80 from the high frequency power supply 81. Further, a predetermined high frequency bias power is supplied to the electrode 66b of the electrostatic chuck 66 from the high frequency bias power supply 74.

Accordingly, in the processing chamber 51, an Ar plasma is generated by the high frequency power supplied to the induction coil 80 and thus Ar ions are generated. These ions are attracted toward the target 83 by the DC voltage applied to the target 83 and collide with the target 83. Hence, the target 83 is sputtered to emit particles. At this time, the amount of particles emitted from the target 83 is optimally controlled by the DC voltage applied to the target 83.

The particles emitted from the sputtering target 83 are mostly ionized while passing through the plasma. Here, the particles emitted from the target 83 are scattered downward in a state where ionized ions and electrically neutral atoms are mixed. Particularly, when the pressure in the processing chamber 51 is increased to a certain level, a plasma density is increased so that the particles can be ionized with high efficiency. The ionization rate at this time is controlled by the high frequency power supplied from the high frequency power supply 81.

When the ions are introduced into an ion sheath region formed on the wafer W with a thickness of about a few mm by the high frequency bias power applied to the electrode 66b of the electrostatic chuck 66 from the high frequency bias power supply 74, the ions are acceleratedly attracted with strong directivity toward the wafer W and deposited on the wafer W. As a consequence, the Cu thin film is formed.

At this time, the wafer temperature is set to be maintained at a high level in a range from 65° C. to 350° C., and the bias power applied from the high frequency bias power supply 74 to the electrode 66b of the electrostatic chuck 66 is controlled. With such control, the film formation using Cu and the etching using Ar are controlled to improve the mobility of Cu. As a result, the Cu can be filled with good fillability even in a trench or a hole having a small opening.

In view of ensuring good fillability, the pressure in the processing chamber 51 (processing pressure) is preferably set in a range from 1 mTorr to 100 mTorr (from 0.133 Pa to 13.3 Pa) and more preferably set in a range from 35 mTorr to 90 mTorr (from 4.66 Pa to 12.0 Pa). Further, the DC power supplied to the Cu target is preferably set in a range from 4 kW to 12 kW and more preferably in a range from 6 kW to 10 kW.

Further, when the opening of the trench or the hole is large, the film formation can be carried out by setting the wafer temperature to a low level in a range from −50° C. to 0° C. and further decreasing the pressure in the processing chamber 51. Accordingly, the film forming rate can be increased. In this case, the film forming method is not limited to the iPVD, and the conventional PVD such as the conventional sputtering, the ion plating or the like can be employed.

<Barrier Film Forming Apparatus>

Figure 10:
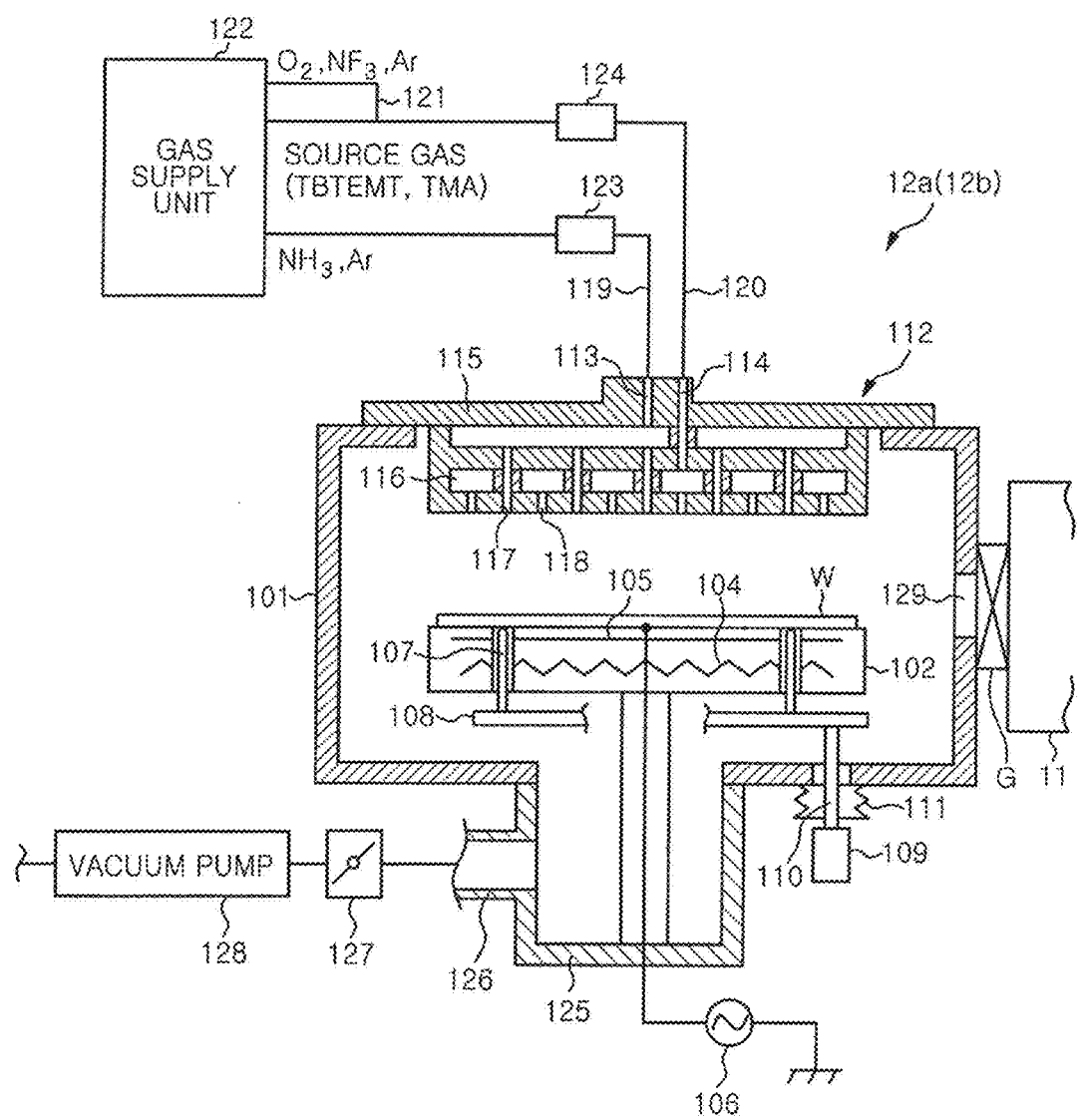
FIG. 10 is a cross sectional view showing a barrier film forming apparatus for forming a barrier film formed of a TaAlN film, which is installed in the film forming system shown in FIG. 8.

Hereinafter, a barrier film forming apparatus 12a (12b) for forming a barrier film will be described. FIG. 10 is a cross sectional view showing an example of the barrier film forming apparatus for forming a TaAlN film by the thermal ALD. The barrier film may also be formed by a thermal CVD.

As shown in FIG. 10, the barrier film forming apparatus 12a (12b) includes a cylindrical processing chamber 101 made of, e.g., aluminum or the like. The processing chamber 101 has therein a mounting table 102 made of ceramic, e.g., AlN, for mounting thereon the wafer W. The mounting table 102 has therein a heater 104 and is supported by a cylindrical supporting member 103 provided at a central bottom portion of the processing chamber 101. The heater 104 emits a heat by a power supplied from a heater supply (not shown).

Further, an electrode 105 is embedded in the mounting table 102, and a high frequency power supply 106 is connected to the electrode 105. Further, three wafer support pins 107 (only two pins are shown) for transferring a wafer are provided in the mounting table 102 such that they can protrude from and retreat into the surface of the mounting table 102. The wafer support pins 107 are fixed to a support plate 108. Moreover, the wafer support pins 107 are vertically moved through the support plate 108 by vertically moving a rod 110 by a driving unit 109 such as an air cylinder or the like. Reference numeral 111 denotes a bellows.

A shower head 112 for introducing a gas for forming a TaAlN film, a purge gas or the like into the processing chamber 101 in the form of shower is provided at a ceiling wall of the processing chamber 101 so as to face the mounting table 102. The shower head 112 has a first inlet channel 113 and a second inlet channel 114 which extend from a top surface thereof thereinto. The first and the second inlet channel 113 and 114 are separately provided in the shower head 112 so that gases supplied thereinto are not mixed with each other.

An upper space 115 and a lower space 116 are provided inside the shower head 112. The first inlet channel 113 is connected to the upper space 115, and first gas injection lines 117 extend from the upper space 115 to the bottom surface of the shower head 112. A second inlet channel 114 is connected to the lower space 116, and second injection lines 118 extend from the lower space 116 to the bottom surface of the shower head 112.

A first gas supply line 119 is connected to the first inlet channel 113, and a second gas supply line 120 is connected to the second inlet channel 114. The first and the second gas supply line 119 and 120 are connected to corresponding gas supply sources of the gas supply unit 122. $NH_3$ gas as a nitriding gas (reduction gas) for forming a nitride by reducing a Ta compound and an Al compound, a dilution gas, Ar gas used as a plasma gas or the like is supplied into the first gas supply lie 119. TBTEMT as a Ta source material and TMA as an Al source material are supplied into the second gas supply line 120. As for the source material, another gas other than the described gases may be used. Further, a third gas supply line 121 is connected to the second gas supply line 120, and $O_2$, $NF_3$ used for cleaning in the processing chamber 101 or the like, a carrier gas, a dilution gas, Ar gas used as a plasma gas are supplied from the gas supply source of the gas supply unit 122. Provided on the first gas supply line 119 and the second gas supply line 120 are gas control units 123 and 124 including a gas flow rate controller, a valve and the like.

A gas exhaust chamber 125 is provided at the bottom portion of the processing chamber 101, and a gas exhaust line 126 is connected to a side of the gas exhaust chamber 125. A throttle valve 127 and a vacuum pump 128 for the pressure control are connected to the gas exhaust line 126, so that the processing chamber 101 can be exhausted to vacuum.

A wafer loading/unloading opening 129 is formed at a sidewall of the processing chamber 101, so that a wafer W can be loaded from and unloaded into the first vacuum transfer chamber 11 in a state where a gate valve G is opened.

In the barrier film forming apparatus 12a (12b), the gate valve G is opened and the wafer W is mounted on the mounting table 102. Then, the gate valve G is closed, and the processing chamber 101 is evacuated by the vacuum pump 128 to control the pressure in the processing chamber 101 to be maintained at a predetermined level. In a state where the wafer W is heated to a predetermined temperature through the mounting table 102 by the heater 104, a TaAlN film is formed by ALD. At this time, the temperature of the mounting table is 300° C. to 400° C.

Specifically, as shown in FIG. 3, for example, TBTEMT as a Ta source material is supplied from the gas supply unit 122 to the shower head 112 through the second gas supply line 120, and then is injected from the second gas injection lines 118 through the second inlet channel 114 and the lower space 116 to be adsorbed onto the surface of the wafer W. Next, Ar gas as a purge gas from the gas supply lines 119 and 120 is injected through the first and the second discharge lines 117 and 118 of the shower head 112, thereby purging the processing chamber 101. Thereafter, $NH_3$ gas as a nitriding gas (reduction gas) is supplied to the shower head 112 through the first gas supply line 119, and then injected through the first gas discharge lines 117 via the first gas inlet line 113 and the upper space 115. Accordingly, TBTEMT adsorbed onto the wafer W is nitrided (reduced). Next, a purge process same as the previous purge process is performed to purge the processing chamber. By repeating a predetermined number of cycles of the above processes (preferably 4 to 8 cycles), a single process of forming a TaN unit film is completed. Next, a single process of forming an AlN film is completely by sequentially performing supply and adsorption of TMA→purge of the processing chamber 101→nitriding (reduction) using $NH_3$→purge of the processing chamber 101 in the same manner described above except that TBTEMT is replaced by TMA as an Al source material. By repeating the TaN unit film formation and the AlN film formation a predetermined number of times, a TaAlN film having a predetermined film thickness is formed.

After the formation of the TaAlN film, Ar gas is supplied into the processing chamber 101 and a high frequency power is supplied from the high frequency power supply 106 to the electrode 105 of the mounting table 102. Accordingly, an Ar plasma is generated, impact is applied to the TaAlN film by ions in the plasma to modify the film. As a consequence, barrier property of the film is improved. The high frequency power at this time has a frequency of, e.g., 13.65 MHz, and a power of, e.g., 100 W to 1000 W. The above description is an example of the sequence shown in FIG. 3. However, the plasma processing may be performed in the order shown in FIGS. 4 to 6.

<Ru Liner Film Forming Apparatus>

Figure 11:
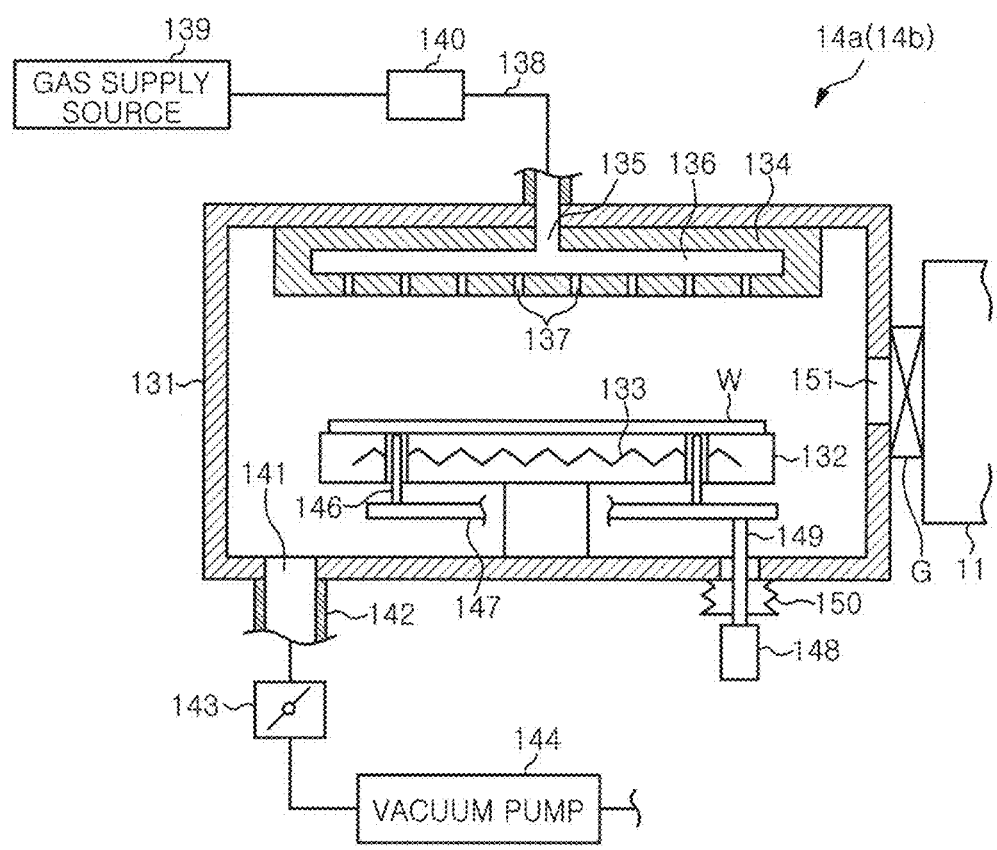
FIG. 11 is a cross sectional view showing a Ru liner film forming apparatus for forming a Ru liner film, which is installed in the film forming system shown in FIG. 8.

Hereinafter, a Ru liner film forming apparatus 14a (14b) for forming a Ru liner film will be described. The Ru liner film may be preferably formed by a thermal CVD. FIG. 11 is a cross sectional view showing an example of the Ru liner film forming apparatus for forming a Ru liner film by the thermal CVD.

As shown in FIG. 11, the Ru liner film forming apparatus 14a (14b) includes a cylindrical processing chamber 131 made of, e.g., aluminum or the like. The processing chamber 131 has therein a mounting table 132 made of ceramic, e.g., AlN, for mounting thereon the wafer W, and the mounting table 132 has therein a heater 133. The heater 133 emits a heat by a power supplied from a heater supply (not shown).

A shower head 134 is provided at the ceiling wall of the processing chamber 131 so as to face the mounting table 132. Through the shower head 134, a purge gas or a processing gas for forming a Ru film is introduced into the processing chamber 131 in the form of shower. The shower head 134 has a gas inlet port 135 at an upper portion thereof and a gas diffusion space 136 therein. A plurality of gas injection openings 137 is formed in the bottom of the shower head 134. A gas supply line 138 is connected to the gas inlet port 135, and a gas supply source 139 is connected to the gas supply line 138 to supply the purge gas or the processing gas for forming the Ru film. Further, a gas control unit 140 including a gas flow rate controller, a valve and the like is disposed on the gas supply line 138. As described above, ruthenium carbonyl $(Ru_3(CO)_{12})$ may preferably be used as a Ru forming gas. The Ru film can be formed by thermally decomposing ruthenium carbonyl.

A gas exhaust port 141 is provided in the bottom portion of the processing chamber 131, and a gas exhaust line 142 is connected to the gas exhaust port 141. A throttle valve 143 and a vacuum pump 144 for the pressure control are connected to the gas exhaust line 142, so that the processing chamber 131 can be exhausted to vacuum.

Three wafer support pins 146 (only two pins are shown) for transferring a wafer are provided in the mounting table 132 such that they can protrude from and retreat into the surface of the mounting table 132. The wafer support pins 146 are fixed to a support plate 147. The wafer support pins 146 are vertically moved together with the support plate 147 by vertically moving a rod 149 by a driving unit 148 such as an air cylinder or the like. Reference numeral 150 denotes a bellows. A wafer loading/unloading opening 151 is formed at a sidewall of the processing chamber 131, so that a wafer W can be loaded from and unloaded into the first vacuum transfer chamber 11 in a state where a gate valve G is opened.

In the Ru liner film forming apparatus 14a (14b), the gate valve G is opened and the wafer W is mounted on the mounting table 132. Then, the gate valve G is closed, and the processing chamber 131 is evacuated by the vacuum pump 144 to control the pressure in the processing chamber 131 to be maintained at a predetermined level. In a state where the wafer W is heated to a predetermined temperature through the mounting table 132 by the heater 133, a processing gas such as ruthenium carbonyl $(Ru_3(CO)_{12})$ or the like is introduced into the processing chamber 131 from the gas supply source 139 through the gas supply line 138 and the shower head 134. Accordingly, the reaction of the processing gas is performed on the surface of the wafer W, and the Ru liner film is formed on the wafer W.

The Ru film may be formed by using another film forming material other than ruthenium carbonyl, e.g., the aforementioned pentadienyl ruthenium compounds, together with decomposition gas such as $O_2$ gas. Further, the Ru film may be formed by PVD. However, it is preferable to perform film formation by CVD using ruthenium carbonyl because it is possible to obtain good step coverage and reduce the amount of impurities in the film.

<Apparatus Used for Other Processes>

Although the processes up to the formation of the Cu film in the above embodiments can be performed by the above-described film forming system 1, the post processes such as the annealing process, the CMP process, the cap layer forming process and the like may be performed on the wafer W unloaded from the film forming system 1 by using an annealing apparatus, a CMP apparatus, and a cap layer forming apparatus. Further, the annealing process may be performed by any one of modules of the film forming system 1. These apparatuses have general configurations. These apparatuses and the film forming system 1 constitute the Cu wiring forming system, and integrally controlled by a common control unit having the same function as that of the control unit 40. Accordingly, the methods described in the above embodiments can be integrally controlled by a single recipe.

<Other Application>

While the embodiments of the present invention have been described, the present invention may be variously modified without being limited to the above embodiments. For example, the film forming system is not limited to the type shown in FIG. 8, and may be of a type in which all the film forming apparatuses are connected to a single transfer unit. Further, instead of the multi-chamber type system shown in FIG. 8, a system may be employed in which some of a barrier film, a Ru liner film, and a Cu film are formed in the same film forming system and the other films are formed in separate apparatuses through the exposure to the atmosphere. Alternatively, the respective films may be formed in separate apparatuses through the exposure to the atmosphere.

The above embodiments have described the example in which the method of the present invention is applied to a wafer having a trench and a via (hole). However, the present invention may be applied to the case in which the wafer has only a trench or the case in which the wafer has only a hole. Moreover, the present invention may be applied to filling in devices having various structures such as a single damascene structure, a double damascene structure, a 3D mounting structure or the like. Further, although a semiconductor wafer has been described as an example of a substrate to be processed in the above embodiments, the semiconductor wafer includes a compound semiconductor such as GaAs, SiC, GaN or the like as well as a silicon substrate, and the present invention may be applied to a glass substrate for use in FPD (Flat Panel Display) such as a liquid display device or the like, a ceramic substrate or the like without being limited to a semiconductor wafer.

While the invention has been shown and described with respect to the embodiments, it will be understood by those skilled in the art that various changes and modification may be made without departing from the scope of the invention as defined in the following claims.

What is claimed is:

1. A Cu wiring forming method for forming a Cu wiring by filling Cu in a recess formed in a substrate in a predetermined pattern, the Cu wiring forming method comprising:
    forming a barrier film comprising a TaAlN film on a surface of the substrate, wherein the TaAlN film is formed by thermal atomic layer deposition (ALD);
    forming a Cu film by filling the recess with the Cu film; and
    forming the Cu wiring in the recess by removing the barrier film and the Cu film formed outside the recess while leaving the barrier film and the Cu film formed in the recess, wherein the removing is performed by chemical-mechanical polish,
    wherein forming the barrier film comprises: forming a TaN unit film by a first thermal ALD process; and forming an AlN unit film by a second thermal ALD process.

2. The Cu wiring forming method of claim 1, further comprising, between the forming the barrier film and the forming the Cu film, forming a Ru film on the barrier film.

3. The Cu wiring forming method of claim 2, wherein the Ru film is formed by chemical vapor deposition.

4. The Cu wiring forming method of claim 1, wherein after or during the forming the barrier film, a film deposited on the substrate is subjected to plasma processing and modified by ion impact applied thereto.

5. The Cu wiring forming method of claim 4, wherein a plasma for the plasma processing is generated by applying a high frequency power to a mounting table of the substrate.

6. The Cu wiring forming method of claim 5, wherein the plasma is an Ar plasma.

7. The Cu wiring forming method of claim 4, wherein, between the forming the TaN unit film and the forming the AlN unit film, the film deposited on the substrate is subjected to the plasma processing.

8. The Cu wiring forming method of claim 1, wherein the forming the TaN unit film comprises performing one or more times of a first cycle comprising supplying a Ta compound into a processing chamber and adsorbing the Ta compound onto the substrate, purging the processing chamber, converting the absorbed Ta compound to TaN by nitriding/reduction, and purging the processing chamber; and
wherein the forming the AlN unit film comprises performing one or more times of a second cycle comprising supplying an Al compound into the processing chamber and adsorbing the Al compound onto the substrate, purging the processing chamber, converting the adsorbed Al compound to AlN by nitriding/reduction, and purging the processing chamber, and
wherein a number of the first cycles performed and a number of the second cycles performed are determined based on a predetermined atomic composition ratio between Ta and Al in the barrier film, and wherein the forming the TaN unit film and the forming the AlN unit film are repeated multiple times.

9. The Cu wiring forming method of claim 8, wherein the first cycle is performed 4 to 8 times in forming the TaN unit film, and the second cycle is performed once in forming the AlN unit film.

10. The Cu wiring forming method of claim 8 further comprising absorbing an Al source material onto the substrate before the forming the barrier film.

11. The Cu wiring forming method of claim 1, wherein the TaAlN film has a thickness of 2 nm or less.

12. The Cu wiring forming method of claim 1, wherein the Cu film is formed by physical vapor deposition.

13. The Cu wiring forming method of claim 12, wherein the Cu film is formed by using an apparatus configured to produce a plasma in a processing chamber comprising the substrate, wherein the plasma sputters Cu atoms from a Cu target, wherein sputtered Cu atoms are ionized by the plasma, and wherein the ionized Cu are attracted onto the substrate by a bias power applied to a mounting table of the substrate.

14. A non-transitory computer-readable storage medium storing a program, wherein the program, when executed by a processing device, causes the processing device to perform a method of controlling a Cu wiring forming system to perform a Cu wiring forming method comprising
forming a barrier film comprising a TaAlN film on a surface of a substrate by thermal atomic layer deposition (ALD);
forming a Cu film by filling a recess formed in the substrate with the Cu film; and
forming the Cu wiring in the recess by removing the barrier film and the Cu film formed outside the recess while leave the barrier film and the Cu film formed in the recess, wherein the removing comprises chemical-mechanical polish,
wherein the forming the barrier film comprises: forming a TaN unit film by a first thermal ALD process; and forming an AlN unit film by a second thermal ALD process.

* * * * *